United States Patent
Sunohara et al.

(10) Patent No.: US 7,893,524 B2
(45) Date of Patent: Feb. 22, 2011

(54) WIRING SUBSTRATE AND SEMICONDUCTOR DEVICE AND METHOD OF MANUFACTURING THE SAME

(75) Inventors: Masahiro Sunohara, Nagano (JP); Yoshihiro Machida, Nagano (JP)

(73) Assignee: Shinko Electric Industries, Co., Ltd., Nagano-shi (JP)

( * ) Notice: Subject to any disclaimer, the term of this patent is extended or adjusted under 35 U.S.C. 154(b) by 61 days.

(21) Appl. No.: 12/263,584

(22) Filed: Nov. 3, 2008

(65) Prior Publication Data

US 2009/0115073 A1 May 7, 2009

(30) Foreign Application Priority Data

Nov. 6, 2007 (JP) .............................. 2007-288890

(51) Int. Cl.
  H01L 21/00 (2006.01)
  H01L 21/44 (2006.01)
  H01L 23/02 (2006.01)

(52) U.S. Cl. ........................ 257/678; 257/730; 257/734; 257/778; 257/E23.141; 438/52; 438/108; 438/117

(58) Field of Classification Search .................. 257/618, 257/678, 713, 730, 734, 773, 778; 438/108, 438/117, 52

See application file for complete search history.

(56) References Cited

U.S. PATENT DOCUMENTS

| | | | |
|---|---|---|---|
| 6,809,412 B1 * | 10/2004 | Tourino et al. | 257/678 |
| 2004/0094815 A1 * | 5/2004 | Park et al. | 257/419 |
| 2008/0011508 A1 * | 1/2008 | Sunohara et al. | 174/260 |

FOREIGN PATENT DOCUMENTS

JP  2000-22317  1/2000

\* cited by examiner

*Primary Examiner*—Hsien-ming Lee
(74) *Attorney, Agent, or Firm*—Kratz, Quintos & Hanson, LLP

(57) ABSTRACT

In a wiring substrate of a semiconductor device, a hollow portion is provided under a pad wiring portion including a connection pad, and thus a wiring layer has a cantilever structure in which the pad wiring portion is formed as an aerial wiring, and a semiconductor chip is flip-chip connected to the connection pad. The pad wiring portion including the connection pad is formed on a sacrifice layer which is filled in a recess portion in an interlayer insulating layer of the wiring substrate, then the semiconductor chip is flip-chip connected to the connection pad, and then the hollow portion is provided by removing the sacrifice layer.

10 Claims, 12 Drawing Sheets

(plan view)

(plan view)

(perspective view)

(plan view)

(plan view)

WIRING SUBSTRATE AND SEMICONDUCTOR DEVICE AND METHOD OF MANUFACTURING THE SAME

CROSS-REFERENCE TO RELATED APPLICATIONS

This application is based on and claims priority of Japanese Patent Application No. 2007-288890 filed on Nov. 6, 2007, the entire contents of which are incorporated herein by reference.

BACKGROUND OF THE INVENTION

1. Field of the Invention

The present invention relates to a wiring substrate and a semiconductor device and a method of manufacturing the same and, more particularly, a wiring substrate on which a semiconductor chip is flip-chip mounted, and a semiconductor device constructed by flip-chip mounting the semiconductor chip on the wiring substrate and a method of manufacturing the same.

2. Description of the Related Art

In the prior art, there is a semiconductor device that is constructed by flip-chip mounting a semiconductor on a wiring substrate. As shown in FIG. 1, in a wiring substrate 100 of a semiconductor device in the prior art, through holes TH are provided on a core substrate 200 to pass through there, and a through hole plating layer 220 is provided on inner surfaces of the through holes TH respectively. A resin 240 is filled in holes of the through holes TH.

Also, a first wiring layer 300 connected to the through hole plating layers 220 is formed on an upper surface side of the core substrate 200. The first wiring layer 300 is connected to a lower wiring layer (not shown), which is formed on the lower surface side of the core substrate 200, via the through hole plating layers 220. Also, a first interlayer insulating layer 400 is formed on the first wiring layer 300, and first via holes VH1 whose depth is set to arrive at the first wiring layer 300 are formed in the first interlayer insulating layer 400.

A second wiring layer 320 connected to the first wiring layer 300 via the first via holes VH1 is formed on the first interlayer insulating layer 400.

Also, similarly a second interlayer insulating layer 420 is formed on the second wiring layer 320, and second via holes VH2 whose depth is set to arrive at the second wiring layer 320 are provided in the second interlayer insulating layer 420. Also, a third wiring layer 340 connected to the second wiring layer 320 via the second via holes VH2 is formed on the second interlayer insulating layer 420. A solder resist 500 in which opening portions 500a are provided on connection portions respectively is formed on the third wiring layer 340.

Also, solder bumps 620 of a semiconductor chip 600 are flip-chip connected to the connection portions of the third wiring layer 340. Also, an underfill resin 700 is filled in a clearance between the semiconductor chip 600 and the wiring substrate 100.

In Patent Literature 1 (Patent Application Publication (KO-KAI) 2000-22317), it is set forth that, in a method of manufacturing a printed-wiring board to which an IC chip is flip-chip connected, by removing an oxide film on the surface of the solder resist and an organic residue on the metal surface of the pads exposed from opening portions in the solder resist by means of an oxygen plasma, the printed-wiring board that is excellent in connectivity and reliability can be obtained.

Meanwhile, in the above semiconductor device, a coefficient of thermal expansion is different between the wiring substrate 100 (a resin, a copper wiring, or the like) and the semiconductor chip (silicon chip) 600. Therefore, a thermal stress is generated when a heat is applied to the semiconductor device, and accordingly a warp occurs in the semiconductor device in some cases.

In recent years, as the semiconductor chip 600, the stained silicon technology has been employed for improving the performance, or the interlayer dielectric layer having low dielectric constant has been employed.

Such high-performance semiconductor chip is relatively weak against the stress, and thus deterioration of operating characteristics is easily caused due to the stress. In the prior art, the underfill resin 700 is employed as the buffer material that absorbs a difference in coefficient of thermal expansion between the wiring substrate 100 and the semiconductor chip 600. However, it is becoming difficult to protect sufficiently the high-performance semiconductor chip, and it is probable that reliability of the semiconductor device becomes an issue.

SUMMARY OF THE INVENTION

It is an object of the present invention to provide a wiring substrate capable of ensuring sufficient reliability by preventing deterioration in performance of a semiconductor chip even when a high-performance semiconductor chip is flip-chip mounted, and a semiconductor device using this wiring substrate and a method of manufacturing the same.

The present invention is concerned with a wiring substrate, which comprises a wiring layer having a pad wiring portion including a connection pad for flip-chip connecting a semiconductor chip, formed on a surface layer side; wherein a hollow portion is provided under the pad wiring portion including the connection pads, thereby the wiring layer has a cantilever structure in which the pad wiring portion is formed as an aerial wiring.

In one mode of the present invention, the wiring layers including the connection pads are formed on the insulating layer of the wiring substrate, and the recess portion is provided in the insulating layer under the pad wiring portions including the connection pads to constitute the hollow portion. In this manner, the wiring layers are constructed as the cantilever structure in which the pad wiring portions including the connection pads are formed as the aerial wirings.

Then, the semiconductor device is constructed by flip-chip connecting the semiconductor chip to the connection pads of the wiring substrate. As described above, when a heat is applied to the semiconductor device, a thermal stress is easily caused due to a difference in coefficients of thermal expansion between the wiring substrate and the semiconductor chip. Thus, in some cases the operating performance of the semiconductor chip is deteriorated and also reliability of connection in the semiconductor chip cannot be obtained.

In the present invention, the pad wiring portions including the connection pads to which the semiconductor chip is connected are constructed as the aerial wirings that do not contact the underlying layer. Therefore, the connection portions between the semiconductor chip and the connection pads are provided as the flexible structure that moves vertically like a spring. As a result, a thermal stress caused in the semiconductor chip can be relaxed, and reliability of the electrical connection can be improved.

Also, a stress applied to the semiconductor chip can be absorbed because the connection pads are moved. Therefore, even when the high-performance semiconductor chip that is weak against the stress is mounted, the semiconductor chip can be protected from the stress and deterioration in performance can be prevented.

In the above invention, the semiconductor chip may be hermetically sealed by providing the cap to the wiring substrate in constructing the semiconductor device.

Also, the present invention is concerned with a method of manufacturing a semiconductor device, which comprises the steps of: forming a recess portion in a member for forming a wiring layer on an upper surface; filling a sacrifice layer in the recess portion; forming the wiring layer to extend from the member to the sacrifice layer such that a pad wiring portion including a connection pad of the wiring layer is arranged on the sacrifice layer; flip-chip connecting a semiconductor chip to the connection pad; and providing a hollow portion under the pad wiring portion by removing the sacrifice layer selectively from the member and the wiring layer before or after the step of flip-chip connecting the semiconductor chip.

In the present invention, first, the recess portion is provided in the member (the insulating layer, or the like) on which the wiring layers are to be formed, and the sacrifice layer (the resist layer, or the like) is filled in the recess portion. Then, the wiring layers are formed such that the pad wiring portions including the connection pads are arranged on the sacrifice layer.

Then, in the preferred mode of the present invention, the semiconductor chip is flip-chip connected to the connection pads on the sacrifice layer, and then the hollow portion is constructed under the pad wiring portions by removing selectively the sacrifice layer.

In this mode, the semiconductor chip is mounted in a state that the connection pads are fixed on the sacrifice layer, and then the hollow portion is obtained by removing the sacrifice layer. Therefore, the above semiconductor device in which the semiconductor chip is flip-chip connected to the connection pads acting as the moving portion can be manufactured stably with good yield. Otherwise, the hollow portion may be provided before the semiconductor chip is mounted, and then the semiconductor chip may be flip-chip connected to the connection pads that are arranged on the hollow portion.

As described above, in the present invention, even when the high-performance semiconductor chip is mounted, deterioration of performance of the semiconductor chip can be prevented and thus sufficient reliability can be ensured.

DETAILED DESCRIPTION OF THE PREFERRED EMBODIMENTS

Embodiments of the present invention will be explained with reference to the accompanying drawings hereinafter.

First Embodiment

Figure 7:
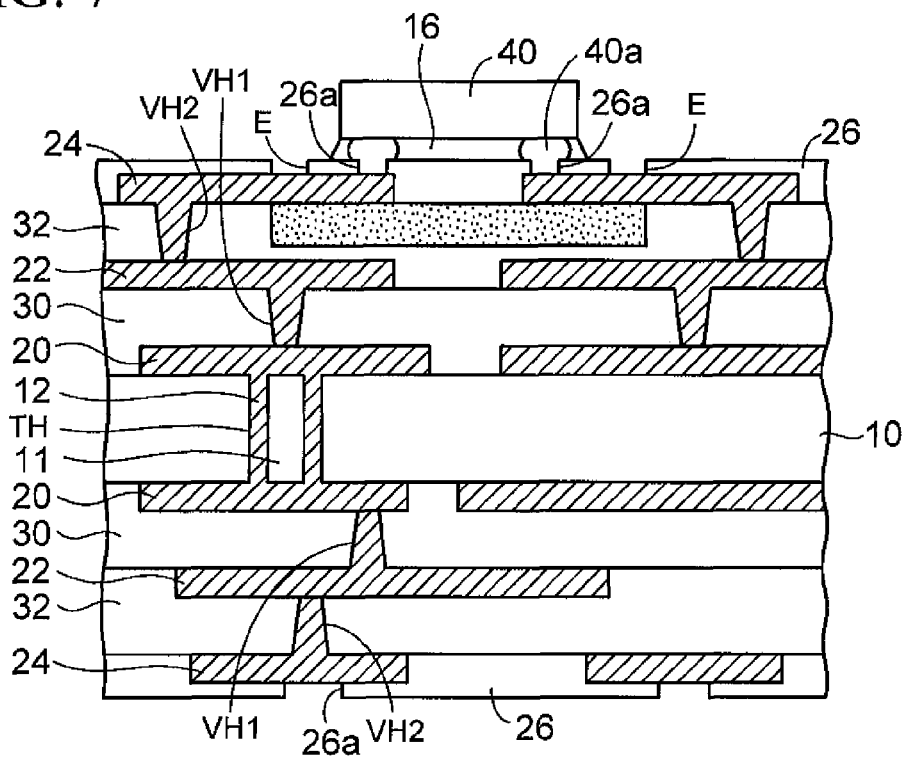
FIG. 7 is a sectional view (#6) showing the method of manufacturing the semiconductor device according to the first embodiment of the present invention.
Figure 8:
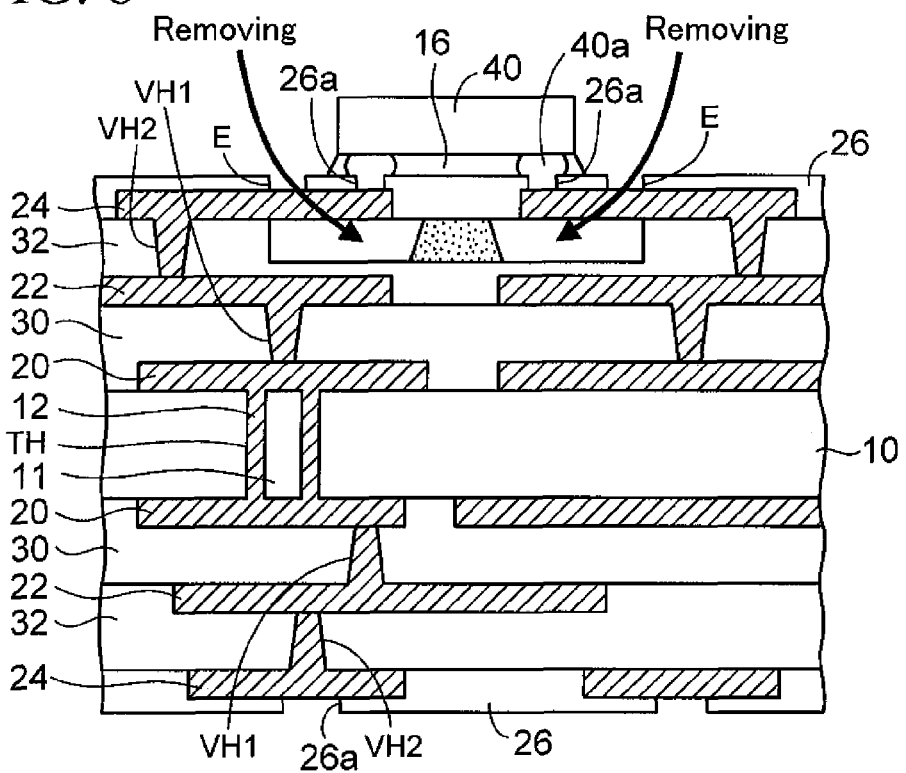
FIG. 8 is a sectional view (#7) showing the method of manufacturing the semiconductor device according to the first embodiment of the present invention.
Figure 9:
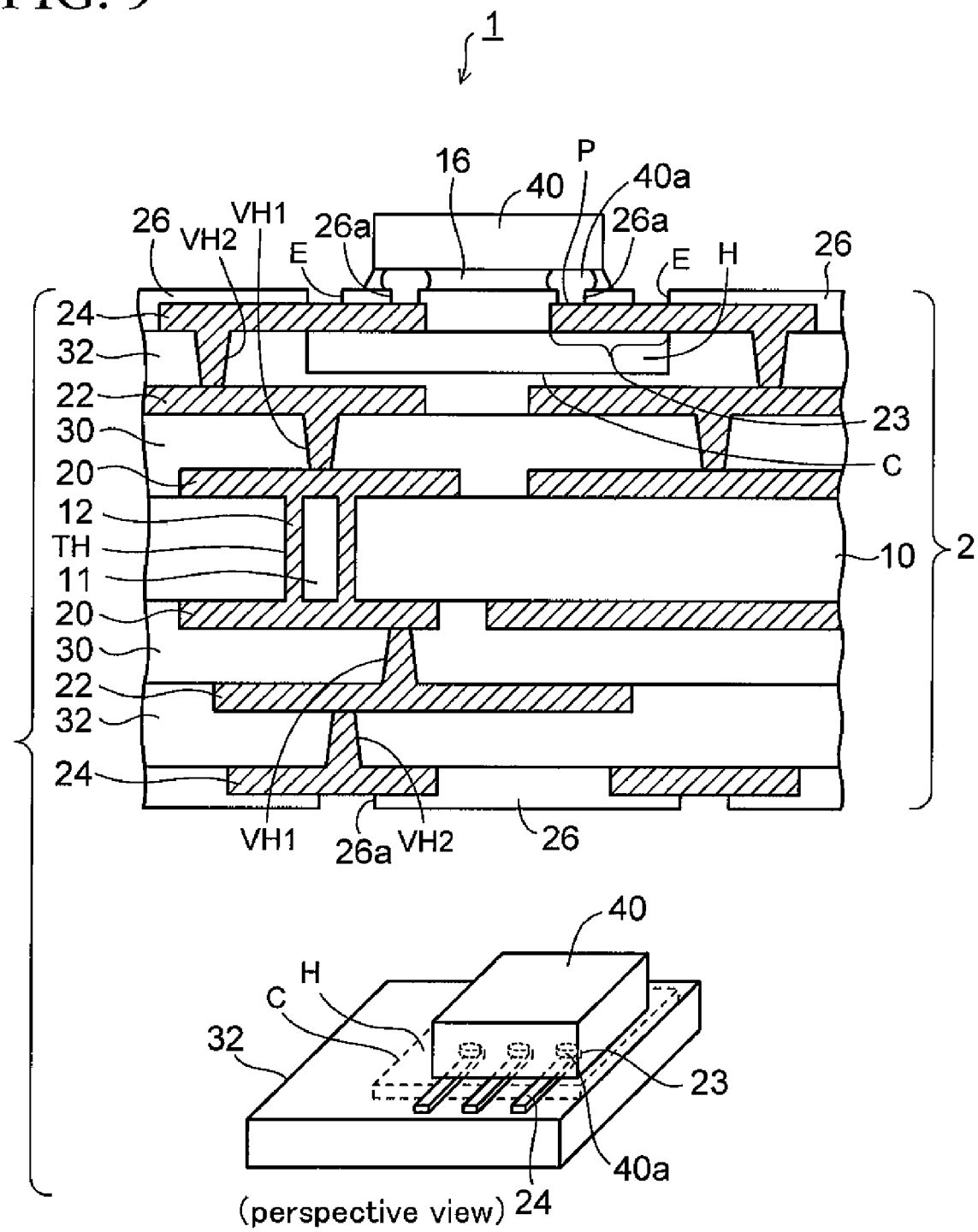
FIG. 9 is a sectional view and a perspective view showing the semiconductor device according to the first embodiment of the present invention.

FIG. 2 to FIG. 8 are views showing a method of manufacturing a semiconductor device according to a first embodiment of the present invention, and FIG. 9 is a view showing the semiconductor device similarly.

Figure 1:
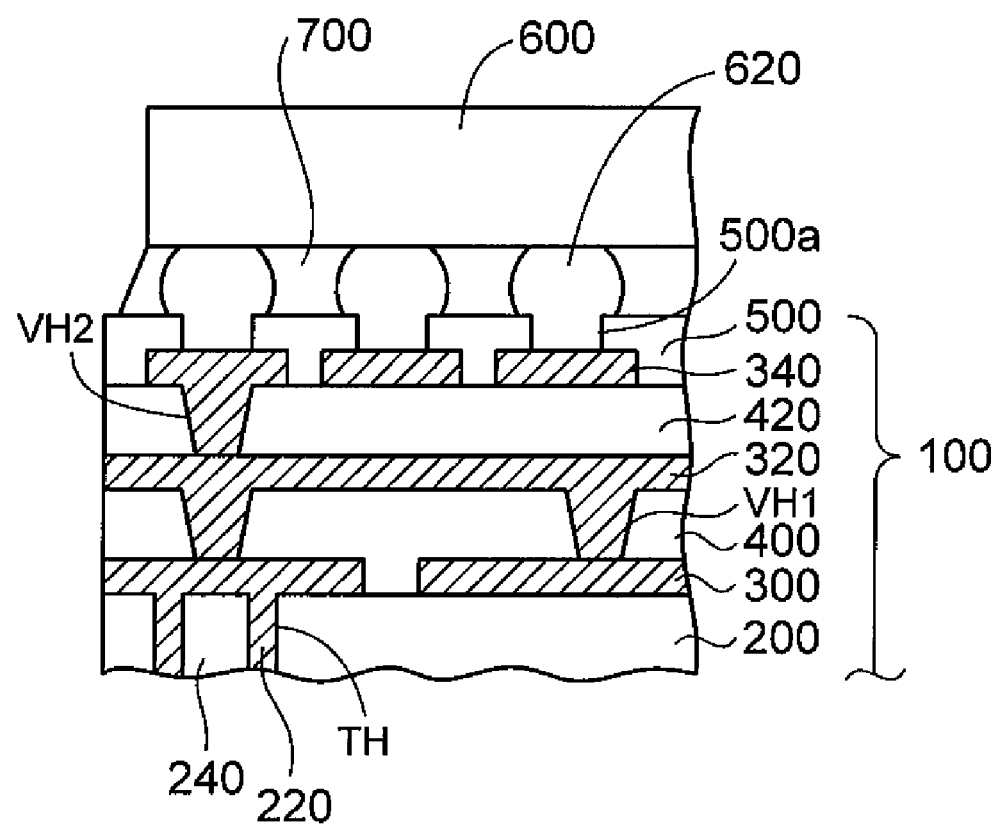
FIG. 1 is a sectional view showing a semiconductor device in the prior art.
Figure 2A:
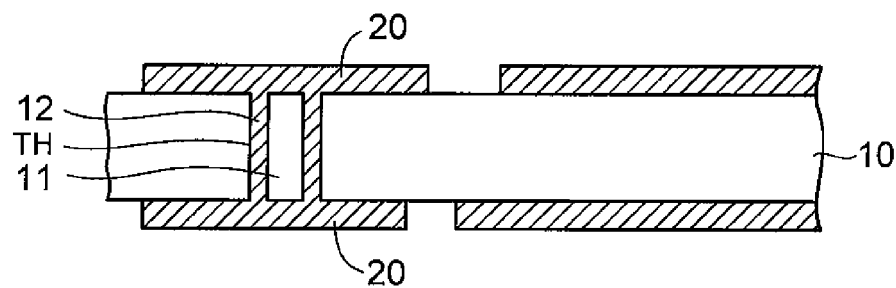
FIGS. 2A to 2C are sectional views (#1) showing a method of manufacturing a semiconductor device according to a first embodiment of the present invention.

In the method of manufacturing the semiconductor device of the present embodiment, first, a structure having a sectional structure shown in FIG. 2A is prepared. Through holes TH are provided in a core substrate 10 to pass through it in a thickness direction, and a through hole plating layer 12 is formed on inner surfaces of the through holes TH. A resin 11 is filled in holes in the through holes TH.

First wiring layers 20 are formed on both surface sides of the core substrate 10 respectively such that both layers are connected mutually via the through hole plating layer 12. As the core substrate 10, a substrate made of a glass cloth that is impregnated with a resin, or the like, a silicon substrate, a glass substrate, or the like is preferably used. When the silicon substrate is employed, an insulating layer is formed on both surfaces of the silicon substrate and inner surfaces of the through holes.

In this case, the through electrode may be filled in all through holes TH, and the first wiring layers 20 on both surface sides may be connected mutually via the through electrodes.

Figure 2B:
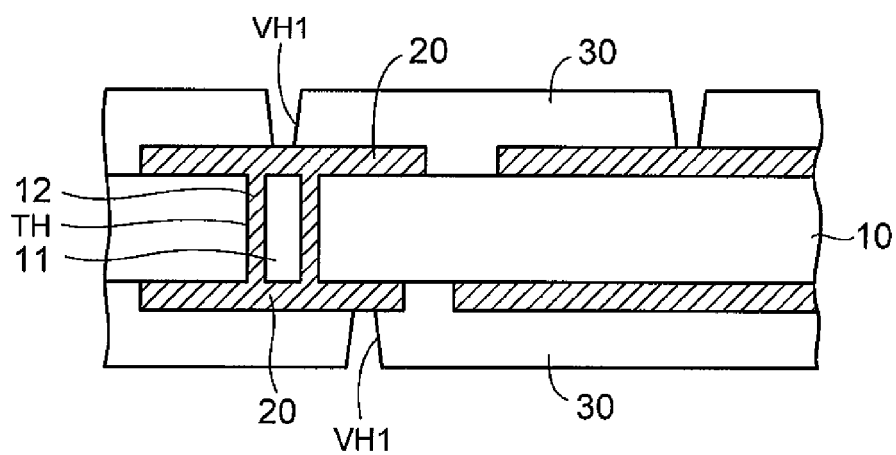

Then, as shown in FIG. 2B, a first interlayer insulating layer 30 is formed on the first wiring layers 20 on both surface sides of the core substrate 10 respectively by pasting a resin film such as an epoxy resin, a ployimide resin, or the like. When the silicon substrate is employed as the core substrate 10, a silicon oxide layer (SiO$_2$), or the like may be formed by the CVD method as the first interlayer insulating layer 30.

Also, the first interlayer insulating layer 30 on both surface sides is processed by a laser, an anisotropic dry etching (RIE, or the like). Thus, first via holes VH1 whose depth arrives at the first wiring layers 20 are formed respectively.

Figure 2C:
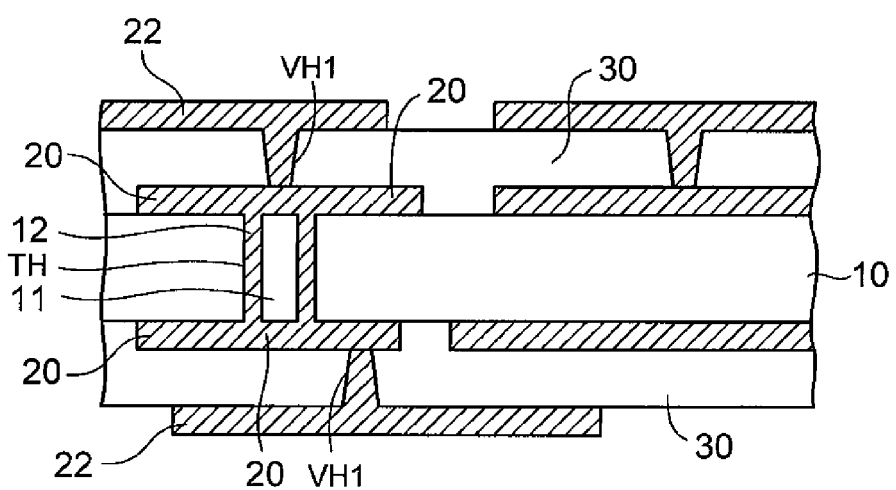

Then, as shown in FIG. 2C, second wiring layers 22 connected to the first wiring layers 20 via the first via holes VH1 are formed on the first interlayer insulating layer 30 on both surface sides of the core substrate 10 respectively. The second wiring layers 22 are formed by the semi-additive process, or the like.

Figure 3A:
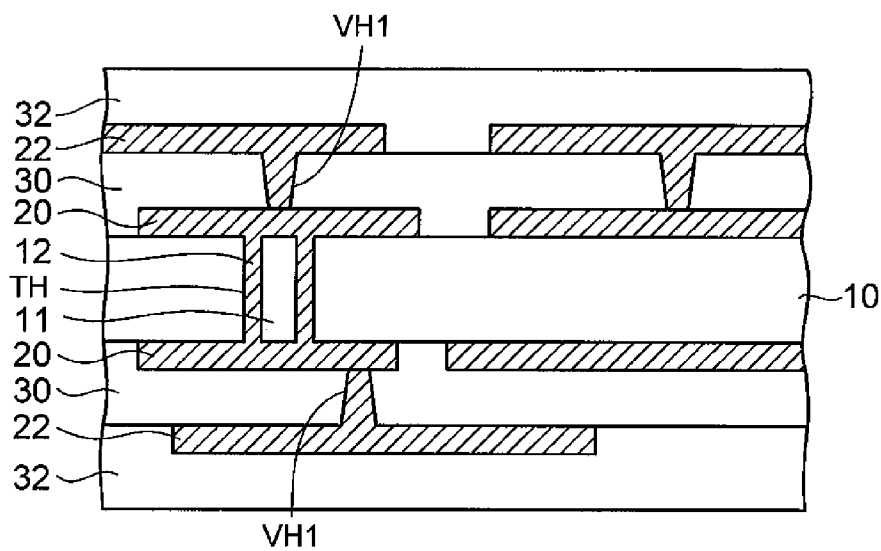
FIGS. 3A to 3C are sectional views (#2) showing the method of manufacturing the semiconductor device according to the first embodiment of the present invention.
Figure 3B:
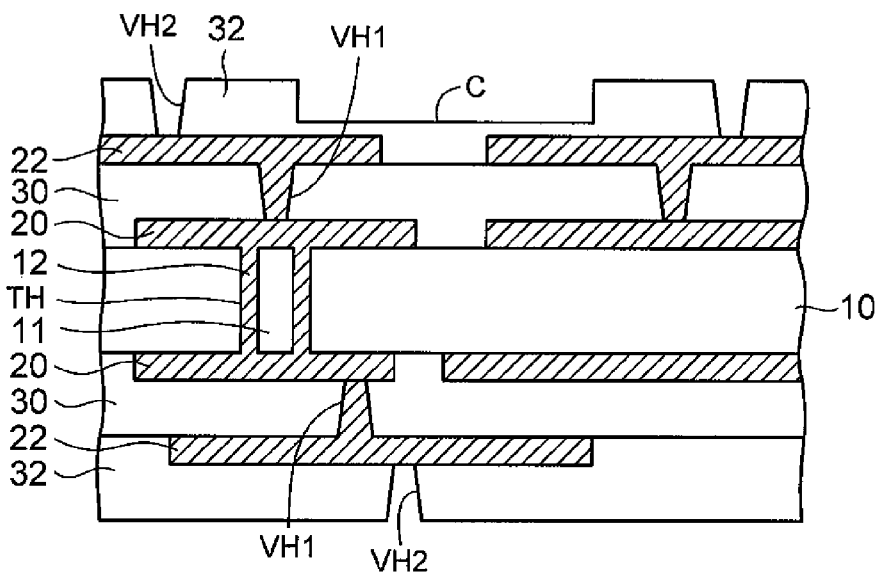

Then, as shown in FIG. 3A, a second interlayer insulating layer 32 is formed on the second wiring layers 22 on both surface sides of the core substrate 10 respectively. Then, as shown in FIG. 3B, a recess portion C is formed by processing the second interlayer insulating layer 32 on the upper surface side of the core substrate 10. The recess portion C is provided in an area in which the semiconductor chip is mounted (area in which pad wiring portions including connection pads of the wiring substrate are arranged), and is set to have an area that is larger than an area of the semiconductor chip.

In an example in FIG. 3B, the second interlayer insulating layer 32 still remains on the lower surface of the recess portion C and upper surfaces of the second wiring layers 22. In this case, the recess portion C may be formed such that the upper surfaces of the second wiring layers 22 are exposed. Then, as also shown in FIG. 3D, second via holes VH2 whose depth arrives at the second wiring layers 22 are formed respectively by processing the second interlayer insulating layer 32 on both surface sides of the core substrate 10.

Figure 3C:
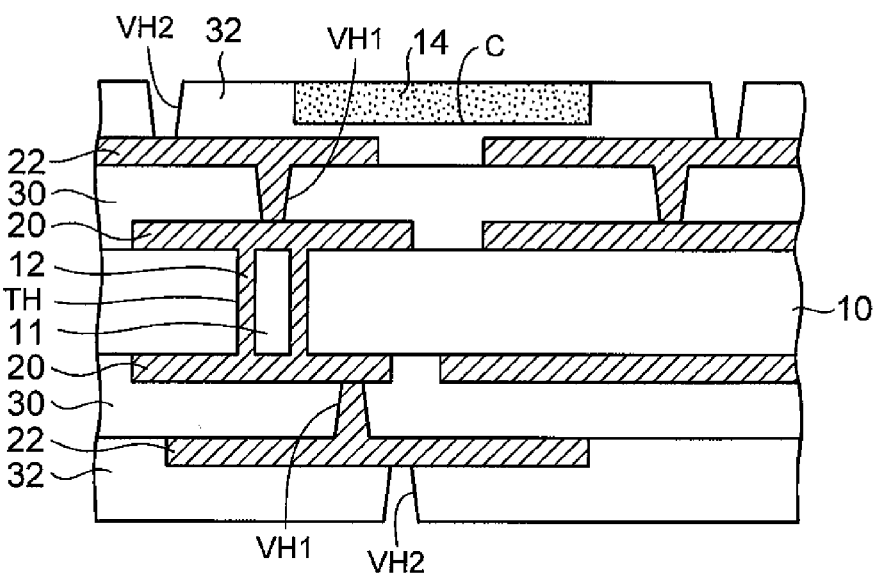

Then, as shown in FIG. 3C, a sacrifice resist layer 14 is filled in the recess portion C on the second interlayer insulating layer 32. The sacrifice resist layer 14 functions as a dummy layer to shape the recess portion C as a hollow portion, as described later. The sacrifice resist layer 14 is filled selectively in the recess portion C by the dispenser, the screen printing, or the like.

Alternately, a sacrifice metal layer made of nickel, or the like may be filled in the recess portion C instead of the sacrifice resist layer 14. When the sacrifice metal layer is employed, before the second via holes VH2 are formed in the second interlayer insulating layer 32 but after the metal layer is formed like a blanket by the plating method, the sputter method, or the like to embed the recess portion C, the sacrifice metal layer is filled selectively in the recess portion C by polishing the metal layer by means of the CMP, or the like.

Figure 4A:
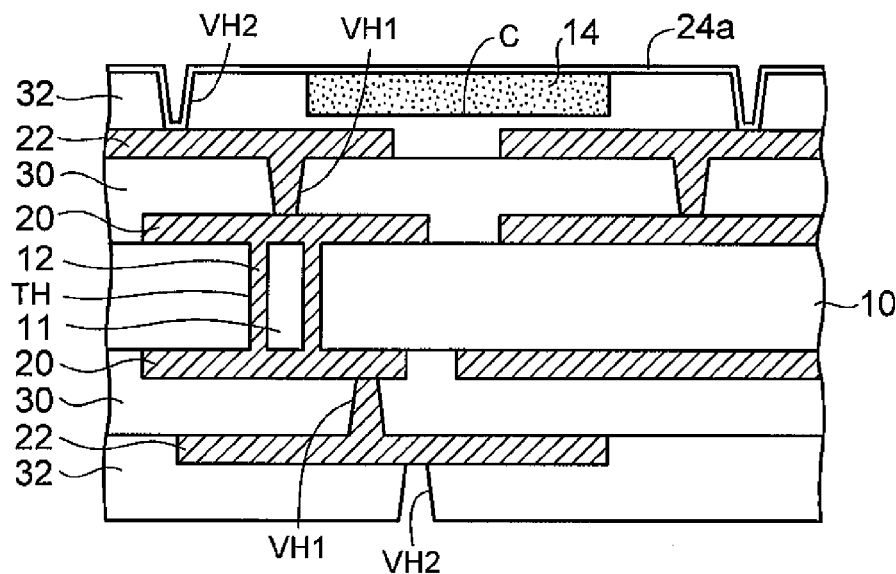
FIGS. 4A and 4B are sectional views (#3) showing the method of manufacturing the semiconductor device according to the first embodiment of the present invention.

Then, as shown in FIG. 4A, a titanium (Ti) layer and a copper (Cu) layer are formed sequentially from the low side on the second interlayer insulating layer 32 and the sacrifice resist layer 14 and on the inner surfaces of the second via holes VH2 by the sputter method. Thus, a seed layer 24a is formed. Otherwise, a Cu layer may be formed by the electroless plating as the seed layer 24a.

Figure 4B:
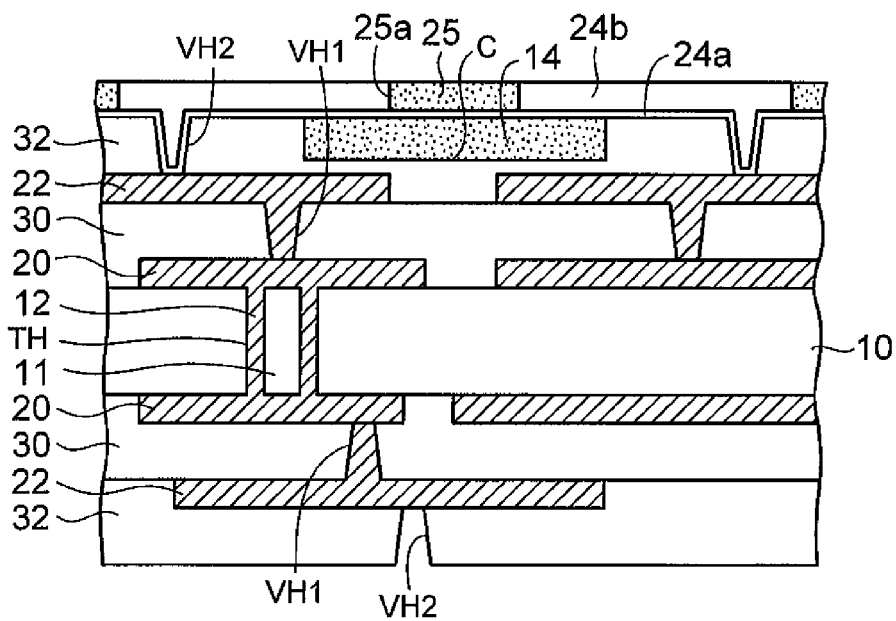

Then, as shown in FIG. 4B, a plating resist 25 in which an opening portion 25a is provided in the portion in which a third wiring layers are to be arranged is formed on the seed layer 24a. Then, a metal plating layer 24b made of Cu, or the like is formed in the opening portion 25a in the plating resist 25 by the electroplating using the seed layer 24a as a plating power feeding path. Then, the plating resist 25 is removed, and then the seed layer 24a is etched by using the metal plating layer 24b as a mask.

Figure 5:
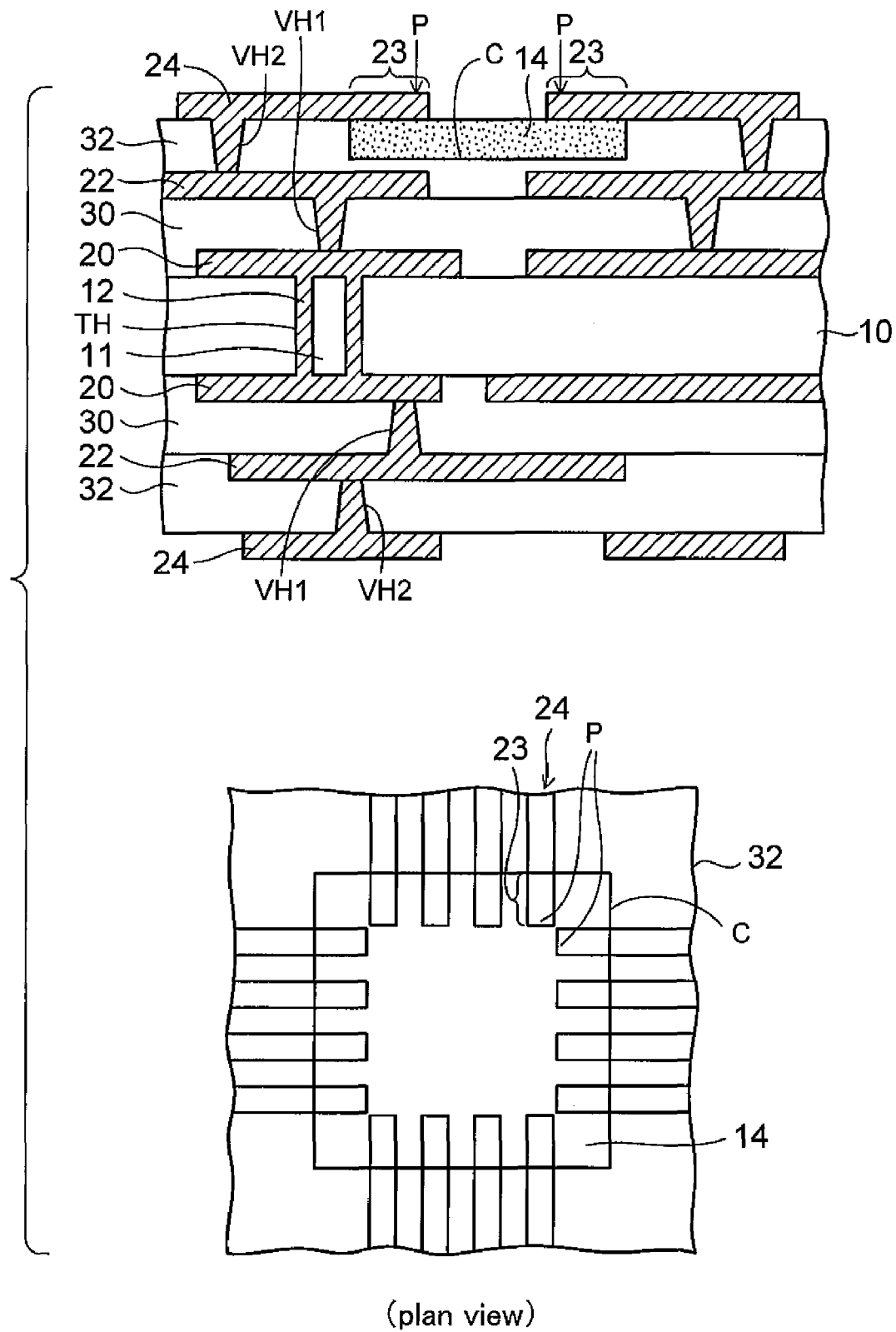
FIG. 5 is a sectional view and a plan view (#4) 6 showing the method of manufacturing the semiconductor device according to the first embodiment of the present invention.

With the above, as shown in FIG. 5, third wiring layers 24 are formed on the second interlayer insulating layer 32 and the sacrifice resist layer 14. In FIG. 5, the third wiring layers 24 are illustrated as a single layer, but actually is composed of the seed layer 24a and the metal plating layer 24b. The third wiring layers 24 are connected to the second wiring layers 22 via the second via holes VH2 respectively.

Also, the third wiring layers 24 are extended from the second interlayer insulating layer 32 to the sacrifice resist layer 14 in a recess portion C, and thus pad wiring portions 23 including connection pads P respectively are arranged side by side on the peripheral side on the sacrifice resist layer 14. When a state of the pad wiring portions 23 in a sectional view in FIG. 5 is viewed from the top, as shown in a plan view in FIG. 5, the pad wiring portions 23 of the third wiring layers 24 are extended onto the sacrifice resist layer 14 filled in the recess portion C, and the connection pads P are arranged side by side in a peripheral type on the peripheral side on the sacrifice resist layer 14.

Similarly, the third wiring layers 24 connected to the second wiring layers 22 via the second via holes VH2 respectively are also formed on the second interlayer insulating layer 32 on the lower surface side of the core substrate 10.

Figure 6:
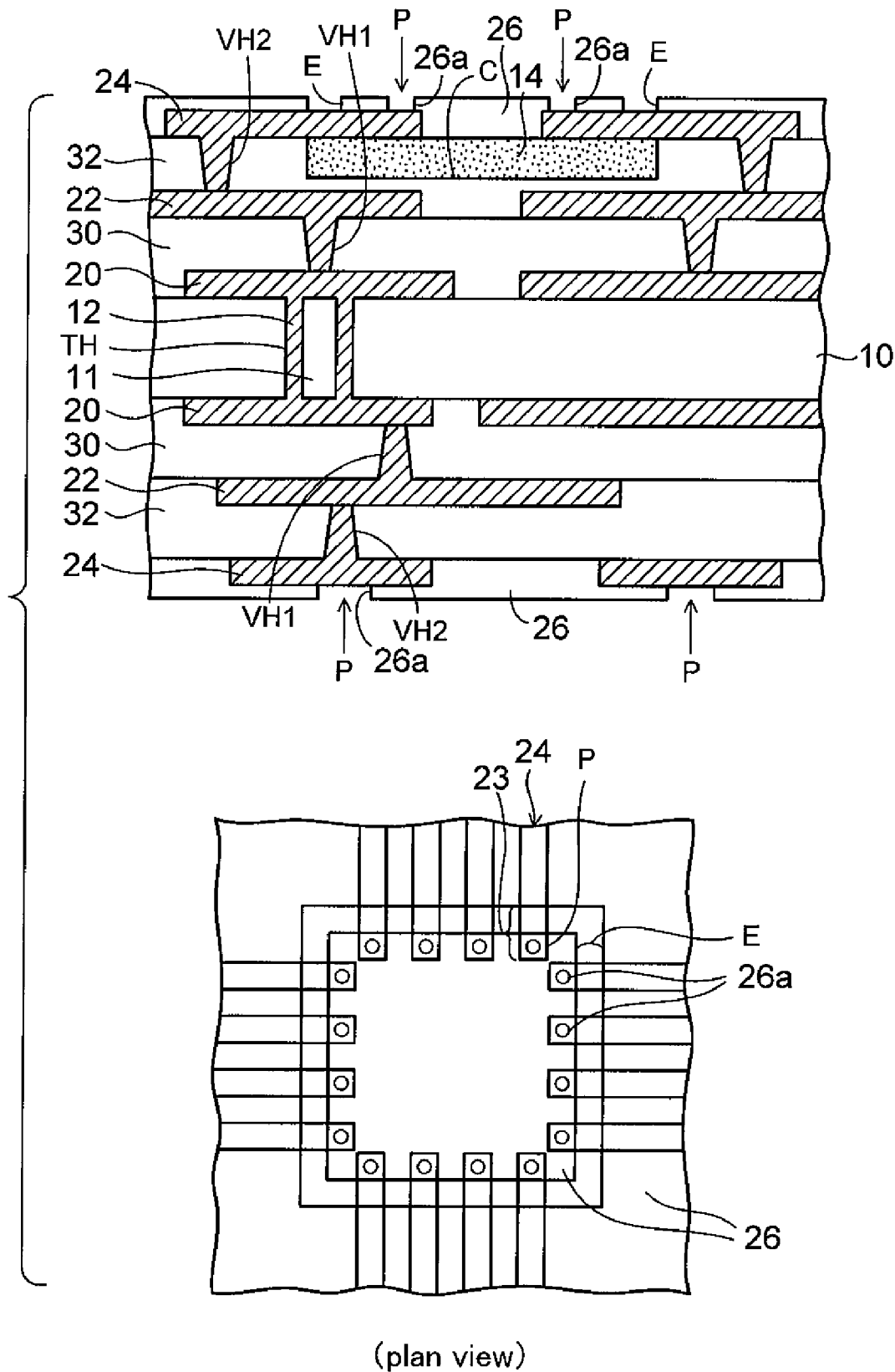
FIG. 6 is a sectional view and a plan view (#5) showing the method of manufacturing the semiconductor device according to the first embodiment of the present invention.

Then, as shown in FIG. 6, a solder resist 26 in which opening portions 26a are provided on the connection pads P of the third wiring layers 24 respectively is formed. By reference to a plan view of FIG. 6 together, a ring-like etching opening portion E is formed at the same time on the solder resist 26 around the peripheral portion on the sacrifice resist layer 14. Also, the solder resist 26 in which opening portions 26a are provided on the connection pads P of the third wiring layer 24 respectively is formed on the lower surface side of the core substrate 10. Also, a Ni/Au plating for the connection is applied to the connection pads P that are exposed from the opening portions 26a in the solder resist 26 on both surface sides of the core substrate 10.

Then, as shown in FIG. 7, bumps 40a of a semiconductor chip 40 are flip-chip connected to the connection pads P of the third wiring layers 24 on the upper surface side of the core substrate 10. Then, an elastic resin 16 is filled in a clearance between the semiconductor chip 40 and the underlying solder resist 26. The elastic resin 16 is made of a polymeric substance that exhibits a rubber elasticity, and its Young's modulus is 100 to 500 MPa. As the elastic resin 16, for example, a silicone rubber is used.

Then, as shown in FIG. 8, the sacrifice resist layer 14 located below the semiconductor chip 40 is removed by dipping the resultant structure in FIG. 7 into a resist removing liquid, or the like. At this time, the resist removing liquid is passed through the etching opening portion E in the solder resist 26 and a space between the pad wiring portions 23 (see a plan view in FIG. 6), and is fed to the sacrifice resist layer 14. Thus, the sacrifice resist layer 14 is removed. Since the solder resist 26 has been cured completely and has a resistance against the resist removing liquid, only the uncured sacrifice resist layer 14 is selectively removed.

Here, when the above-mentioned sacrifice metal layer is used instead of the sacrifice resist layer 14, such sacrifice metal layer (Ni layer, or the like) is etched by using the wet etchant. This wet etchant has the etching selectivity against the third wiring layer 24 (Cu layer), the second interlayer insulating layer 32 (resin layer), and the like.

In this manner, as shown in FIG. 9, the sacrifice resist layer 14 in the recess portion C of the second interlayer insulating layer 32 is removed totally. Therefore, a hollow portion H is provided below the pad wiring portions 23 including the connection pads P to which the semiconductor chip 40 is flip-chip connected. As a result, the pad wiring portions 23 including the connection pads P to which the semiconductor chip 40 is connected are constructed as aerial wirings which are arranged on the hollow portion H respectively.

With the above, a semiconductor device 1 of the present embodiment is obtained.

In this case, in the above method of manufacturing the semiconductor device, in order to secure the stability of flip-chip connection, first, the semiconductor chip 40 is flip-chip connected to the connection pads P of a wiring substrate 2, and then the hollow portion H is provided by removing the sacrifice resist layer 14. In case the connection pads P provided on the hollow portion H can withstand the flip-chip connection when the length of the pad wiring portions 23 is shortened, or the like, it is possible to flip-chip connect the semiconductor chip 40 to the connection pads P after the hollow portion H is provided. In this case, the elastic resin 16 filled under the semiconductor chip 40 is omitted.

Also, in the present embodiment, an example where the hollow portion H is provided in the second interlayer insulating layer 32 under the third wiring layers 24 is illustrated. The hollow portion may be provided in the member under the pad wiring portions including the connection pads to which the semiconductor chip is flip-chip connected. Accordingly, for example, when the wiring layers having the connection pads are formed on the core substrate 10, the similar hollow portion H is provided in the core substrate 10.

As shown in FIG. 9, the semiconductor device 1 of the present embodiment is constructed basically by flip-chip connecting the semiconductor chip 40 to the connection pads P of the wiring substrate 2. In the wiring substrate 2, the through hole plating layer 12 is formed on the inner surfaces of the through holes TH provided in the core substrate 10 respectively, and the resin 11 is filled in holes in the through holes TH.

The first wiring layers 20 connected mutually via the through hole plating layers 12 are formed on both surface sides of the core substrate 10 respectively. The second wiring layers 22 are formed on the first wiring layers 20 on both surface sides of the core substrate 10 via the first interlayer insulating layer 30 respectively. The second wiring layers 22 are connected to the first wiring layers 20 via the first via holes VH1 provided in the first interlayer insulating layer 30 respectively.

Also, the second interlayer insulating layer 32 is formed on the second wiring layers 22 on both surface sides of the core substrate 10 respectively. By reference to a perspective view in FIG. 9 together, the recess portion C whose area is larger than an area of the semiconductor chip 40 is provided in the second interlayer insulating layer 32 on the upper surface side of the core substrate 10 under the semiconductor chip 40. The recess portion C is shaped into the hollow portion H that is made empty like a hollowed-out shape.

Also, the second via holes VH2 that reach the second wiring layers 22 respectively are provided in the second interlayer insulating layer 32, and the third wiring layers 24 connected to the second wiring layers 22 via the second via holes VH2 respectively are formed on the second interlayer insulating layer 32. The third wiring layers 24 are extended from the second interlayer insulating layer 32 onto the hollow portion H, and the pad wiring portions 23 including the connection pads P are arranged on the hollow portion H. The connection pads P are arranged side by side in a peripheral type on the peripheral side of the hollow portion H (see FIG. 6 and a plan view in FIG. 7).

In this manner, one end sides of the third wiring layers 24 are fixed onto the second interlayer insulating layer 32, while the pad wiring portions 23 including the connection pads P of the other end side are arranged as the aerial wiring on the hollow portion H. That is, in the third wiring layers 24, the pad wiring portion 23 including the connection pads P has a cantilever structure acting as the aerial wiring (moving portion). A depth of the hollow portion H can be set to 20 to 100 μm, for example. Also, a length of the pad wiring portions 23 (length protruded from the side surface of the recess portion C toward the inner side) can be set to 50 μm to 1 mm, for example.

In this case, when an elastic force of the pad wiring portions 23 as the aerial wiring respectively should be enhanced further more, the third wiring layers 24 may be constructed by coating the side surfaces and the upper surface of the Cu layer with a Ni layer whose elasticity is strong. Also, the third wiring layers 24 may be formed of a single-layered Ni layer if such third wiring layers do not interfere with the electric characteristics.

Also, the third wiring layers 24 connected to the second wiring layers 22 via the second via holes VH2 respectively are also formed on the second interlayer insulating layer 32 on the lower surface of the core substrate 10.

Also, the solder resist 26 in which the opening portions 26a are provided on the connection pads P is formed on the third wiring layers 24 on both surface sides of the core substrate 10 respectively. The ring-like etching opening portion E is provided around the peripheral portion of the hollow portion H in the solder resist 26 on the upper surface side of the core substrate 10. As described above, the sacrifice resist layer 14 is removed through the etching opening portion E in the solder resist 26, and the hollow portion H is formed.

Then, the bumps 40a of the semiconductor chip 40 (LSI chip) are flip-chip connected to the connection pads P of the third wiring layers 24 on the upper surface side of the core substrate 10. The elastic resin 16 is filled in a clearance between the semiconductor chip 40 and the wiring substrate 2. In this case, the elastic resin 16 is not always provided.

In the semiconductor device 1 of the present embodiment, the third wiring layers 24 have such a cantilever structure that the pad wiring portion 23 is arranged on the hollow portion H respectively, and the connection pads P constitute the moving portions that can move vertically and have an elastic force. Also, the bumps 40a of the semiconductor chip 40 are flip-chip connected to the connection pads P.

The wiring substrate 2 (resin, Cu wiring, or the like) and the semiconductor chip 40 (silicon) have mutually a different coefficient of thermal expansion. Therefore, when a heat is applied in applying the reliability test to the semiconductor device 1 or using actually the semiconductor device 1, a thermal stress is caused due to a difference between the coefficients of thermal expansion, and thus a stress is applied to the semiconductor device 1.

In the present embodiment, even when a stress is applied to the semiconductor device 1, the pad wiring portions 23 (the connection pads P) move flexibly to accommodate to the stress and absorb the stress. Also, when the elastic resin 16 is filled under the semiconductor chip 40, a stress applied to the semiconductor chip 40 can be further dispersed.

In this manner, in the semiconductor device 1 of the present embodiment, the connection portions between the wiring substrate 2 and the semiconductor chip 40 are formed as the flexible structure. Therefore, a thermal stress caused between both members can be relaxed, and reliability of the electrical connection between the semiconductor chip 40 and the wiring substrate 2 can be improved. Also, a stress applied to the semiconductor chip 40 itself can be relaxed. Therefore, even when the high-performance semiconductor chip that employs the stained silicon technology or the interlayer insulating layer of a low dielectric constant to improve the performance is mounted, the semiconductor chip 40 can be protected from a stress and its deterioration of performance can be prevented.

Figure 10:
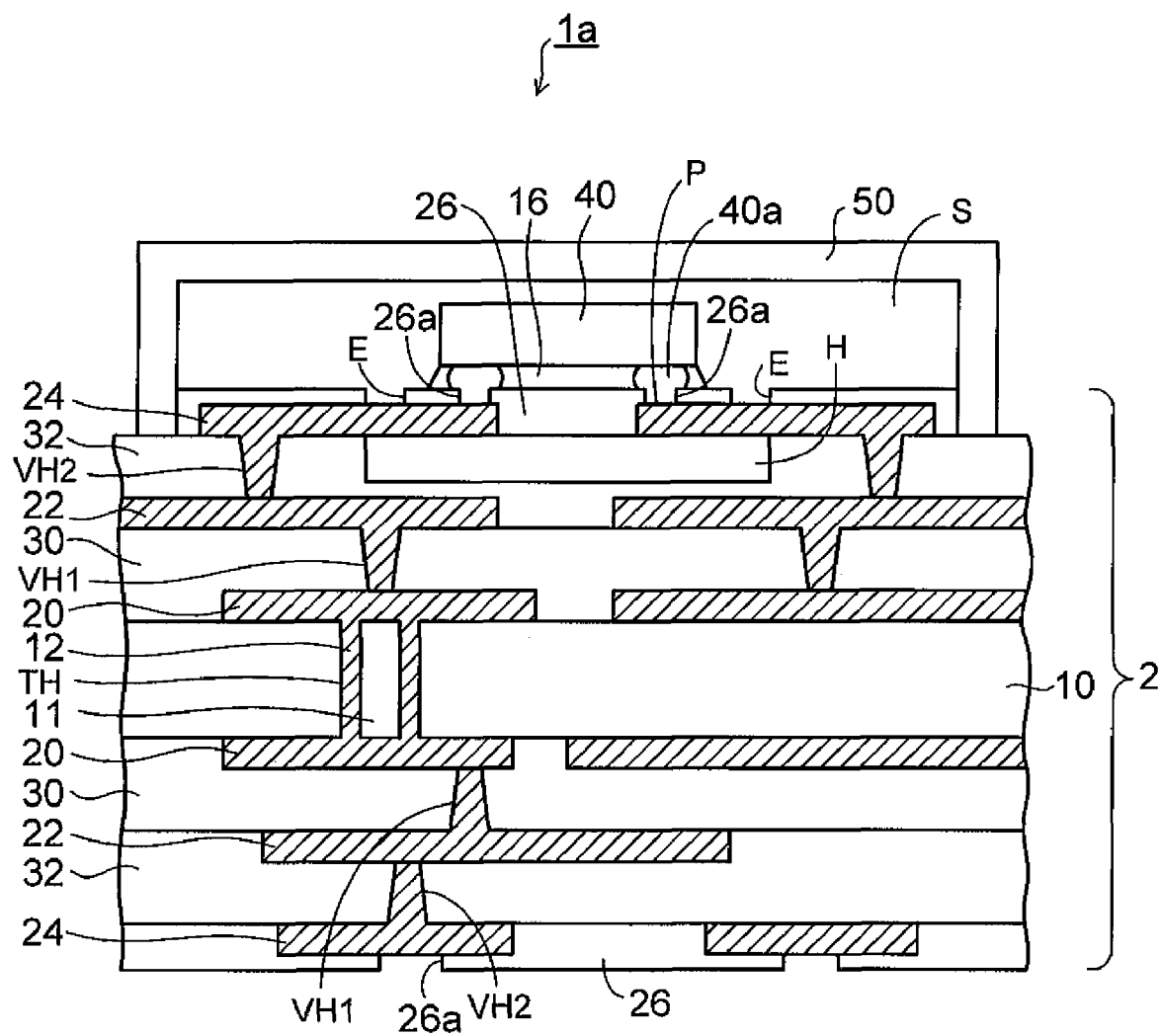
FIG. 10 is a sectional view showing a semiconductor device according to a first variation of the first embodiment of the present invention.

A semiconductor device 1a according to a first variation of the present embodiment is shown in FIG. 10. In the semiconductor device 1a of the first variation, a sealing cap 50 is provided to the wiring substrate 2 of the semiconductor device 1 in FIG. 9, and the semiconductor chip 40 is hermetically sealed in a housing portion S constructed by the sealing cap 50 and the wiring substrate 2. In the semiconductor device 1a of the first variation, reliability of the semiconductor chip 40 whose performance is readily deteriorated due to a moisture can be improved.

Figure 11:
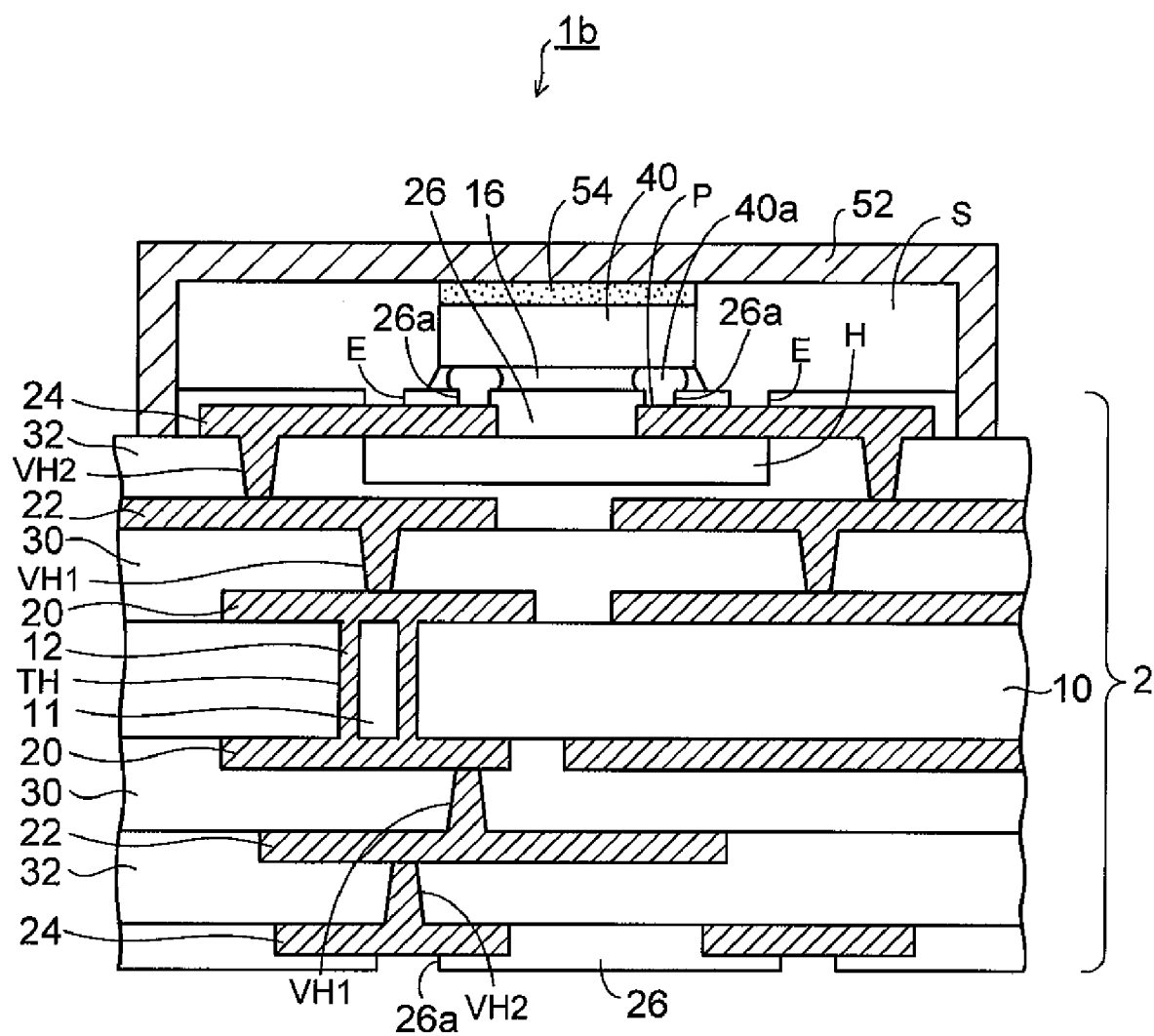
FIG. 11 is a sectional view showing a semiconductor device according to a second variation of the first embodiment of the present invention.

Also, a semiconductor device 1b according to a second variation of the present embodiment is shown in FIG. 11. In the semiconductor device 1b of the second variation, the semiconductor chip 40 (the logic LSI, or the like) that generates easily a heat during the operation may be hermetically sealed by providing a radiation cap 52 made of a metal (Cu, or the like) of high thermal conductivity on the wiring substrate 2. In this case, a thermally conductive adhesive 54 is provided between the upper surface of the semiconductor chip 40 and an inner surface of the radiation cap 52.

Accordingly, a heat generated from the semiconductor chip 40 can be transferred to the radiation cap 52 side via the thermally conductive adhesive 54. Therefore, the heat generation of the semiconductor chip 40 can be suppressed, and the semiconductor chip 40 can be stably operated.

Figure 12:
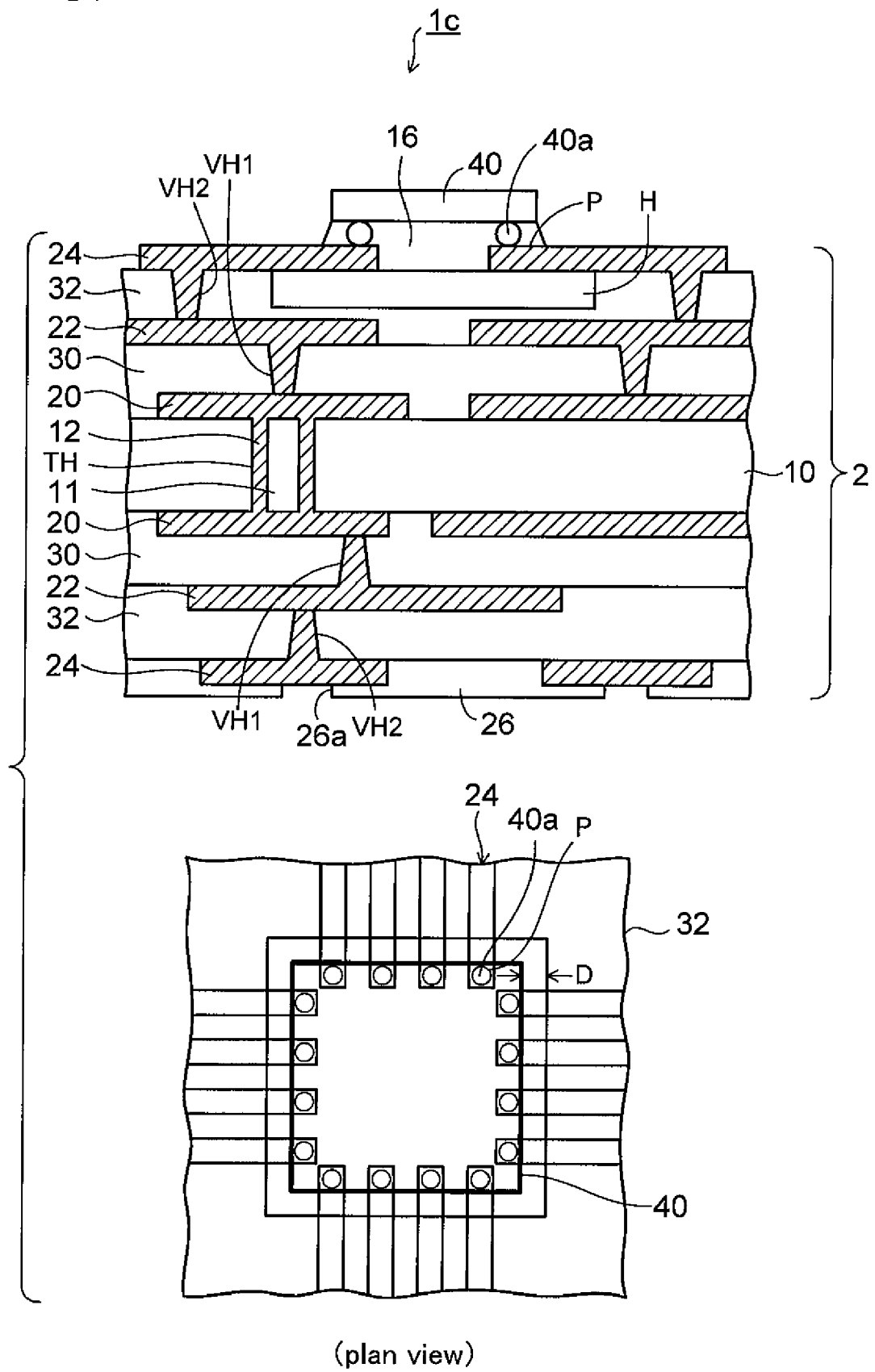
FIG. 12 is a sectional view and a plan view showing a semiconductor device according to a third variation of the first embodiment of the present invention.

Also, a semiconductor device 1c according to a third variation of the present embodiment is shown in FIG. 12. In the semiconductor device 1c of the third variation, the solder resist 26 formed on the upper surface side of the core substrate 10 and described above in FIG. 9 is omitted. In the case of this mode, the sacrifice resist layer 14 can also be removed by the dry ashing using an oxygen plasma, upon removing the above sacrifice resist layer 14 (FIG. 8).

The dry ashing is applied from a surface of the sacrifice resist layer 14 to an inside thereof, which is exposed from a ring-like peripheral portion D (a plan view in FIG. 12) located outside the semiconductor chip 40, and thus the hollow portion H is provided. In this case, in the semiconductor device 1c of the third variation in FIG. 12, the semiconductor chip 40 can be hermetically sealed by providing the sealing cap 50 or the radiation cap 52, like FIG. 10 and FIG. 11.

As explained above, the solder resist 26 in which the opening portions 26a are provided on individual connection pads P respectively is formed in FIG. 9. Alternately, a solder resist in which an opening portion for exposing collectively a plurality of connection pads P on the third wiring layer 24 is provided may be formed.

Second Embodiment

Figure 13:
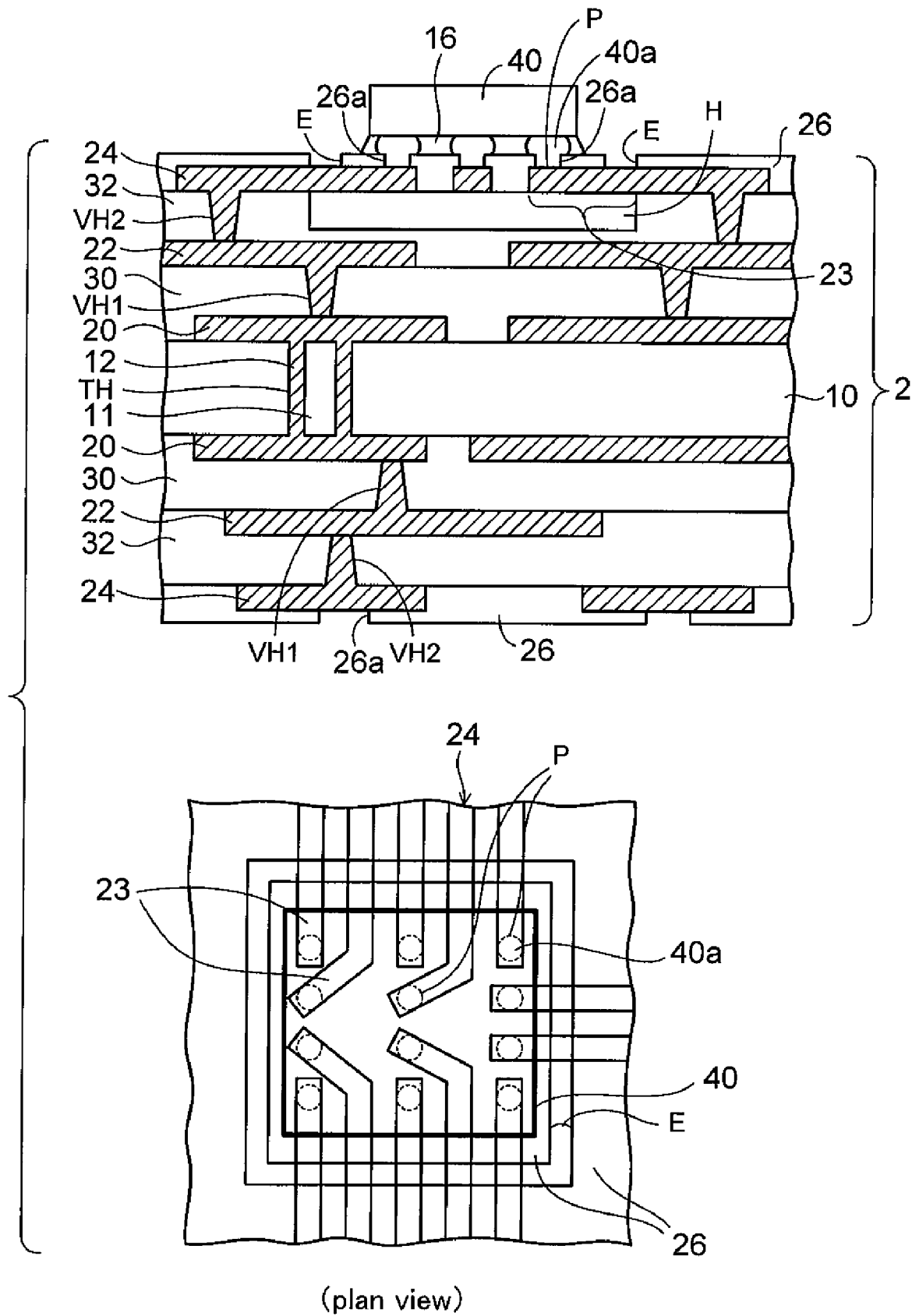
FIG. 13 is a sectional view and a plan view showing a semiconductor device according to a second embodiment of the present invention.

FIG. 13 is a sectional view and a plan view showing a semiconductor device according to a second embodiment of the present invention.

In the above first embodiment, the connection pads P of the third wiring layers 24 are arranged on the peripheral side of the hollow portion H in a peripheral type. In the second embodiment, as shown in FIG. 13, the connection pads P of the third wiring layers 24 are arranged on the hollow portion H in an area-array type.

That is, the pad wiring portions 23 of a plurality of third wiring layers 24 are extended to not only the peripheral portion of the hollow portion H but also the center portion, and the connection pads P are arranged on the hollow portion H in grid-like fashion. Accordingly, like the first embodiment, the pad wiring portions 23 are formed as the aerial wiring that is arranged on the hollow portion H and moved vertically respectively.

Also, the bumps 40a of the semiconductor chip 40 are arranged in an area-array type to correspond to the connection pads P on the third wiring layer 24. Then, the bumps 40a of the semiconductor chip 40 are flip-chip connected to the connection pads P on the third wiring layer 24 of the wiring substrate 2, and the elastic resin 16 is filled under the semiconductor chip 40.

In the second embodiment, a length of the pad wiring portions 23 is increased longer than that in the first embodiment, and a strength of the pad wiring portion 23 is relatively weak. Therefore, it is preferable that the method in which after the semiconductor chip 40 is mounted, the sacrifice resist layer 14 is removing is employed.

In addition, like the first embodiment in FIG. 10 and FIG. 11, the semiconductor chip 40 may be hermetically sealed by providing the sealing cap 50 or the radiation cap 52.

The second embodiment can achieve the similar advantages to those of the first embodiment.

What is claimed is:

1. A wiring substrate, comprising:
   a wiring layer having a pad wiring portion including a connection pad formed on a surface layer side;
   wherein a hollow portion is provided under the pad wiring portion including the connection pad, thereby the wiring layer has a cantilever structure in which the pad wiring portion is formed as an aerial wiring.

2. A wiring substrate according to claim 1, wherein the wiring layer is formed on an insulating layer, the hollow portion is provided in the insulating layer, and an area of the hollow portion is set larger than an area of the semiconductor chip.

3. A semiconductor device, comprising:
   a wiring layer having a pad wiring portion including a connection pad for flip-chip connecting a semiconductor chip, formed on a surface layer side,
   wherein a hollow portion is provided under the pad wiring portion including the connection pad, thereby the wiring layer has a cantilever structure in which the pad wiring portion is formed as an aerial wiring; and
   the semiconductor chip which is flip-chip connected to the connection pad.

4. A semiconductor device according to claim 3, wherein an elastic resin is filled under the semiconductor chip.

5. A semiconductor device according to claim 3, wherein a cap for hermetically sealing the semiconductor chip is provided on the wiring layer.

6. A semiconductor device according to claim 5, wherein the cap is a radiation cap made of a metal, and an upper surface of the semiconductor chip is joined to an inner surface of the radiation cap by a thermally conductive adhesive.

7. A method of manufacturing a semiconductor device, comprising the steps of:
   forming a recess portion in an upper surface of a member for forming a wiring layer;
   filling a sacrifice layer in the recess portion;
   forming the wiring layer to extend from the member to the sacrifice layer such that a pad wiring portion including a connection pad of the wiring layer is arranged on the sacrifice layer;
   flip-chip connecting a semiconductor chip to the connection pad; and
   providing a hollow portion under the pad wiring portion by removing the sacrifice layer selectively from the member and the wiring layer before or after the step of flip-chip connecting the semiconductor chip to the connection pad.

8. A method of manufacturing a semiconductor device, according to claim 7, wherein the sacrifice layer is a resist layer or a metal layer.

9. A method of manufacturing a semiconductor device, according to claim 7, further comprising the step of:
   filling an elastic resin under the semiconductor chip, after the step of flip-chip connecting the semiconductor chip to the connection pad but before the step of providing the hollow portion.

10. A method of manufacturing a semiconductor device, according to claim 7, further comprising the step of:
    hermetically sealing the semiconductor chip with a cap, after the step of providing the hollow portion.

* * * * *